BIASING SCHEME ESPECIALLY SUITED FOR INTEGRATED CIRCUITS

Filed April 19, 1965 2 Sheets-Sheet 1

ROBERT J. WIDLAR
INVENTOR.
BY Roger A. Borovoy
Stuart Lubitz
ATTORNEYS

ROBERT J. WIDLAR

INVENTOR.

BY Roger S. Borovoy
Stuart Lubitz

ATTORNEYS 3,364,434

BIASING SCHEME ESPECIALLY SUITED FOR INTEGRATED CIRCUITS

Robert J. Widlar, Mountain View, Calif., assignor to Fairchild Camera and Instrument Corporation, Syosset, N.Y., a corporation of Delaware Filed Apr. 19, 1965, Ser. No. 449,027
1 Claim. (Cl. 330—22)

ABSTRACT OF THE DISCLOSURE

An amplifier stage, particularly useful in integrated circuits, using a matched pair of differentially connected transistors, a pair of equal value resistors, a biasing transistor, and an amplifier transistor. The amplifier transistor and the biasing transistor have their emitters connected to a common voltage point and their bases connected to a common voltage point via one of the equal resistors; the collector of the biasing transistor is connected to the base of the amplifier transistor via one of the equal resistors; and the base of the biasing transistor is connected via one of the equal resistors to its own collector. The collector of one of the differentially connected transistors is coupled to the base of the biasing transistor and the collector of the other differentially connected transistor is connected to the base of the amplifier transistor, whereby a differential input, single ended output amplifier is provided.

This invention relates to an integrated circuit amplifier and a biasing means for such an amplifier that does not require large bypass capacitors.

It has been common practice in prior art transistor amplifiers, such as common emitter amplifiers shown in FIG. 1, to employ a resistor 10 and a parallel capacitor 12 coupled to the emitter. The resistor is employed for bias stabilization, that is to maintain relatively constant collector current over a range of transistor operating parameters. The capacitor forms a low impedance bypass circuit to bypass the resistor at the frequencies to be amplified, so that the resistor will not substantially affect the gains at these frequencies. The capacitor typically has a value of 10 microfarads. In integrated semiconductor circuits, that is circuits having a plurality of active elements formed in a common semiconductor wafer, the forming of capacitors having a value much greater than even 100 picofarads is difficult. The forming of capacitors having a value as large as 10 microfarads is out of the question with the present state of the integrated circuit art. The above is true in both bulk semiconductor and thin film circuit constructions.

This invention overcomes the shortcomings of prior art biasing arrangements as related to integrated circuitry and provides an amplifier having biasing means which does not require capacitors. To achieve these results, the invented circuit takes advantage of the unique properties of integrated circuits, i.e., excellent thermal coupling and easily achieved precise matching of transistors and resistors. The precise matching results from the simultaneous fabrication of both transistors and their proximity to one another in the same semiconductor wafer which results in the exposure of essentially the same crystalline semiconductor structure to the same process conditions. The intimate thermal coupling results primarily from the proximity of the transistors to one another and the high thermal conductivity of silicon. Both precise matching and satisfactory thermal coupling are not readily attainable in discrete component circuits. As a matter of fact, the use of discrete components in the invented arrangement would be unsatisfactory because of the difficulty in achieving precise component match and adequate thermal coupling.

The invented amplifier employs a pair of transistors, that is a biasing transistor and an amplifier transistor, and a plurality of moderate valued resistors. The transistors and resistors are arranged in a balanced and matched configuration. This balance is typically achieved by connecting both transistor bases to a first common voltage point with equal resistances in the base circuits of both transistors. In addition, the emitters of the biasing and amplifier transistors are connected to a second common voltage point which typically may be a direct connection between the emitters. With both of the transistors precisely matched and at the same temperature, any change in the amplifying transistor, such as changes in the base-emitter voltage or base current due to temperature variations, results in a substantially identical change in the biasing transistor. Therefore, if some fixed current is passed through the biasing transistor, the collector current of the amplifier transistor will remain stable and essentially constant.

For the purpose of a simplified explanation, the cooperation of the transistors in the invented circuit may be broadly analogized to a resistor and potentiometer in parallel. If the temperature changes, the resistance of the resistor is altered. The current through the resistor may be maintained at the original value by manually changing the value of the potentiometer. In the invented circuit, the biasing transistor changes its characteristics automatically and in a manner identical or directly related to the changes that occur in the amplifier transistor as a result of temperature changes so that the bias current is maintained substantially constant.

Briefly, the structure of the invention comprises an amplifier transistor having an emitter, base and collector and a biasing transistor substantially identical with the amplifier transistor having an emitter, base and collector. The bases of said transistors are coupled through equal resistances to a first common voltage point and the emitters of the transistors coupled to a second common voltage point. A fixed current is passed through the biasing transistor, whereby the amplifier transistor is effectively biased without degeneration from a bias stabilization network.

The above general structure and advantages are described in detail in the specification and detailed description which follows and is illustrated in the drawings wherein.

Figure 1:
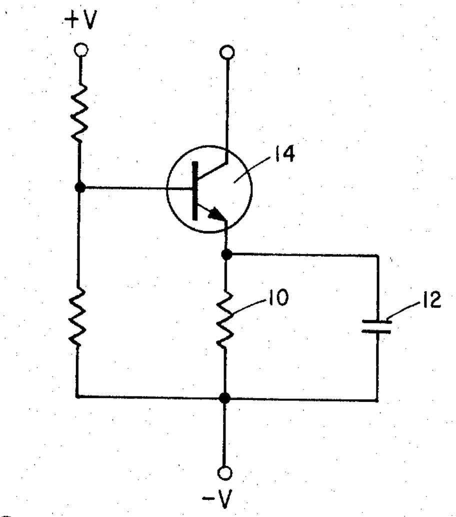
FIG. 1 PRIOR ART
FIG. 1 is an electrical schematic diagram of a prior art biasing arrangement for a common emitter amplifier.

Referring to FIG. 1, a prior art common emitter amplifier is shown and includes a resistor 10 and capacitor 12 for stabilizing the bias of transistor 14. The capacitor 12 typically has the value of about 10 microfarads while resistor 10 has a value of 500 ohms or more. The insertion of resistor 10 into the circuit tends to degrade the gain possible in amplifier transistor 14 while use of capacitor 12 makes it virtually impossible to form such an amplifier in a wholly integrated circuit (unless a capacitor external to the circuit is used).

Figure 2:
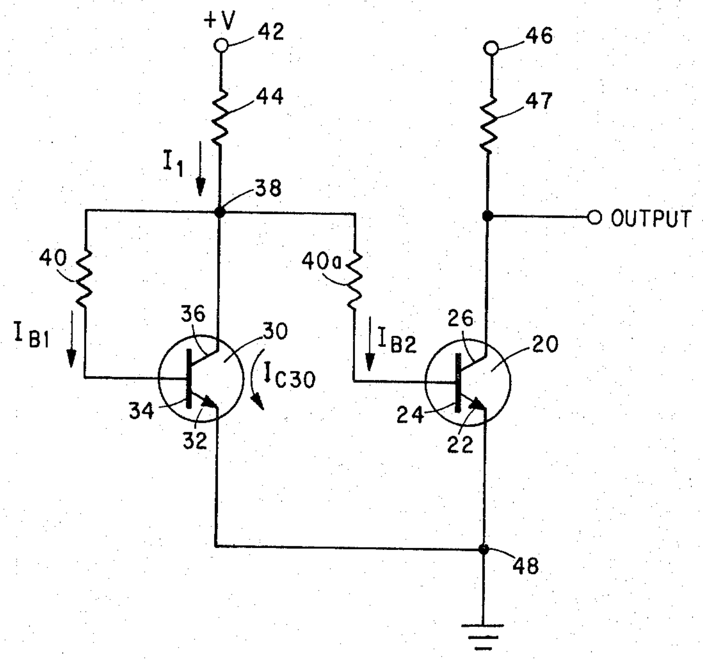
FIG. 2 is an electrical schematic diagram of the invented common emitter amplifier.

Referring to FIG. 2, the invented circuit comprises an amplifier transistor 20 having emitter 22, base 24 and collector 26 and a biasing transistor 30 having emitter 32, base 34 and collector 36. Transistors 20 and 30 have essentially the same characteristics. In the illustrated embodiment, both are NPN. The bases 24 and 34 are connected to a first common voltage point 38 via equal resistors 40 and 40*a*. The collector 36 is also connected to common voltage point 38 and in turn to resistor 44. The terminal 42 is typically connected to the positive terminal of an energizing means (not shown) such as a voltage source V+. The collector 26 is also connected to an energizing means (not shown) such as the positive terminal of a voltage source, via resistor 47 and terminal 46. The voltage source and resistor 44 may be replaced by a current source whereas collector 26 may be connected to a voltage source through any type of load. In some applications, such as the amplifier input stage described in the article "A Monolithic Operational Amplifier" by R. J. Widlar, Electrical Design News, pp. 18–29 (November 1964), it may be desirable to connect terminals 42 and 46 to the same voltage source. In such instances, in order to maintain the balance between transistors 20 and 30, resistors 44 and 47 may have substantially the same value.

The emitters 22 and 32 are connected to a second common voltage point 48 which typically may be ground. It is within the broad scope of the invention to insert small and equal resistors (typically a few hundred ohms or less) between the respective emitters and common voltage point 48.

The above described circuit may be constructed utilizing well known integrated circuit techniques such as is described in U.S. Patent 3,025,589 issued to J. A. Hoerni on Mar. 20, 1962, and U.S. Patent 3,108,359 issued on Oct. 29, 1963, to Gordon E. Moore and Robert N. Noyce, and U.S. Patent 2,981,877 issued April 25, 1961, to Robert N. Noyce. It should be understood that the term "integrated circuit" refers to a circuit fabricated by bulk semiconductor processes, thin film processes, or a combination of these processes. When any or all of these processes are employed in general, a circuit results in which the elements are part of a wafer.

In fabricating the invented circuit by integrated circuit techniques, the transistors 20 and 30 are located as close together as possible. The small size of integrated circuits has enabled center to center spacings of the transistors to be as little as 5 mils. Such close spacing of the transistors 20 and 30 facilitates matching and provides excellent thermal coupling. In addition to the close spacing between transistors 20 and 30, the distance between these transistors and other elements that dissipate appreciable power should be maximized to minimize thermal gradients. This results in further perfecting the identity of the thermal conditions existing at transistors 20 and 30.

With the above structural features in mind, the operation of the invented circuit can now readily be understood. If the value of resistor 40 is equal to resistor 40*a* and transistors 20 and 30 are identical, the collector current of the two transistors will be equal for $V_{CE30}=V_{CE20}$ since both bases are driven from a common voltage point. The collector current for transistor 30 can be reasonably well determined, for example, with resistor 44 connected to $V_{source}$, the collector current;

$$I_{C30}=\frac{V_{source}-V_{BE}}{R_{44}}-\left(\frac{R_{40}+2R_{44}}{R_{44}}\right)I_B \qquad (1)$$

therefore, for $V_{BE}\ll V_{source}$ and $$\left(\frac{R_{40}+2R_{44}}{R_{44}}\right)I_B<<I_{C30}$$

$$I_{C20}=I_{C30}=\frac{V_{source}}{R_{44}} \qquad (2)$$

From this it can be seen that with the transistors substantially identical and resistors 40 and 40*a* equal, the collector currents of the transistors will be equal and determined by the source voltage and the value of resistor 44. Thus, changes in the transistors characteristics due to temperature variations which are common to both transistors will not substantially affect the biasing of amplifier transistor 20.

The assumption in the above derivation, that transistors 20 and 30, are identical, is very closely approached in integrated circuit construction. In addition, the forming of equal value resistors 40 and 40*a* by careful design and processing control can be very nearly approached. The other assumption that $V_{CE30}=V_{CE20}$ has been found to be less critical and the alteration of the collector-emitter voltage of transistor 20 will not appreciably alter the stability of the biasing. This is because the $h_{RE}$ (the reverse feedback ratio for a grounded-emitter amplifier) and the $h_{OE}$ (the output admittance of a grounded-emitter amplifier) for integrated circuit transistor circuits are reasonably low. With such low hybrid parameters, changes in emitter-collector voltage of transistor 20 are not substantially felt by transistor 30.

Figure 3:
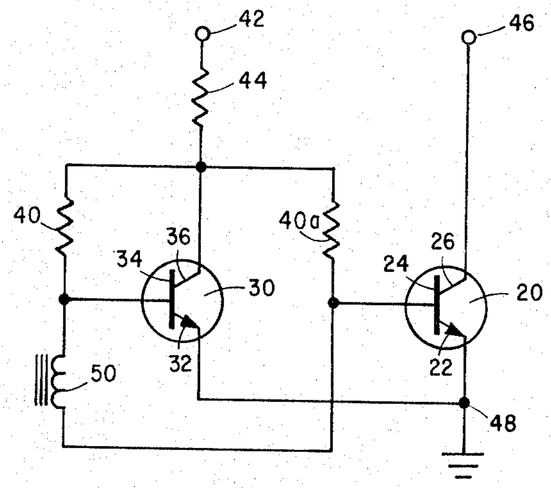
FIG. 3 is another embodiment of the invention employing the invented common emitter amplifier with a transformer coupled input.
Figure 4:
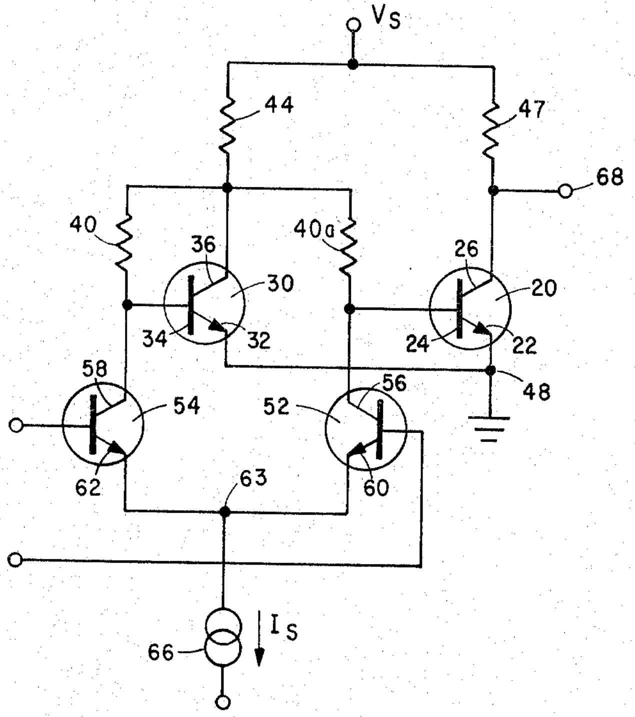
FIG. 4 is another embodiment of the invention employing the invented common emitter amplifier as part of an amplifier input stage having a differential input and single ended output.

Alternate embodiments of the invention are shown in FIGS. 3 and 4 wherein the same invented circuit as shown in FIG. 2 is included along with additional elements. Elements common to all three of the embodiments are designated by the same numerals. The circuit shown in FIG. 3 employs the invented circuit as part of a transformer coupled stage. A transformer secondary 50 is included having one end connected to base 24 and its other end connected to base 34. In such an arrangement the isolation capacitor usually required in transformer coupled stages is eliminated. This enables such stages to be formed by integrated circuit techniques.

The embodiment of the invention shown in FIG. 4 incorporates the invented circuit as the second stage in an operational amplifier. Only part of the amplifier construction is shown in FIG. 4. The remaining portion of the circuit is shown and discussed in the article, "A Monolithic Operational Amplifier" referred to above. The invented circuit has additional advantages in this arrangement when combined with a differentially connected input stage.

An input stage for an operational amplifier ideally has low offset current and voltage, low thermal drift, low input current and high input impedance. These goals are realized by employing a pair of differentially-connected transistors in the input stage.

The differentially-connected transistors readily achieve low offset currents and voltages and low thermal drift. The particular values depend only upon the degree of match between the differential pairs. The low input current and high input impedance can be realized by using very high gain bipolar transistors and by operating them at sufficiently low collector currents. The low collector currents generally require large collector resistances. This can be avoided and much reduced resistance values can be used at the expense of low gain in the differential input stage. Such a low gain can be tolerated where the second stage is well balanced, as is true with the invented amplifier circuit. Thus, the input differential may be operated at low collector currents and consequently low input currents and high input impedance with little if any sacrifice in performance when combined with the invented circuit.

Typically, as shown in FIG. 4, the input stage comprises two substantially identical transistors 52 and 54 with their collectors 56 and 58, respectively, connected to the bases 24 and 34, respectively, of transistors 20 and 30. The emitter 60 and 62 of transistors 52 and 64 are connected to common voltage point 63 which in turn is connected to a current sink 66. The low input currents provided by sink 66 can be supplied by a circuit such as described in U.S. patent application by R. J. Widlar filed contemporaneously with this application and assigned to the same assignee as this invention. The collectors 56 and 58 are coupled to the resistors 40 and 40*a*, which function as collector load resistors and typically have the relatively small value of 2K ohms. With these resistances in circuit, the collectors are operated at 200 microamperes collector current, resulting in a differential stage with a gain of approximately 15. With this gain, the offset contribution of this stage is negligible when connected to a balanced second stage (which is the case when the invented amplifier circuit is employed).

The invented amplifier circuit, in addition to providing the advantage of a balanced configuration for the differential input, has a number of other significant advantages when used in combination with the differential input. Some advantages are (1) it will effectively operate with small DC drops across the resistors 40 and 40*a*, (2) it enables the full differential gain of the input stage to be employed, and (3) it provides a means for a single ended output. The full differential gain of the differential input stage is obtained by the transistor 30 functioning as a unity gain amplifier which inverts the output of transistor 52 and combines it with the output of transistor 54 at the base of transistor 20. Therefore, the full differential gain of the differential input stage is used. A single ended output is readily obtained at the terminal 68 connected to the collector 26. The use of this single ended output avoids continuing the differential connection to a third stage which would increase the number of components and create physical layout problems on the integrated circuit wafer.

From the above description, it can be appreciated that the invented amplifier circuit has many advantageous uses. The ability to operate effectively without capacitors make it especially useful in integrated circuits. The circuit is adapted to take advantage of the unique characteristics of integrated circuits, that is excellent thermal coupling and matching. In combination with other circuit elements, such as transformers and differential input stages, further beneficial results are obtained.

It should be realized that many variations of the invented circuit are possible. For example, if the surface geometries of transistors 20 and 30 are suitably altered so that their emitter-base voltages and current gains are equal at different collector currents, biasing is possible with:

$$\frac{I_{C30}}{I_{C20}}=\frac{R_{42}}{R_{40}}$$

Thus, it should be understood that it is not intended that the specific description and specific form disclosed should limit the invention. It is intended that all modifications, changes and alternatives falling within the principles taught by the invention be included within the scope of the claim.

What is claimed is:

1. An amplifier stage particularly adapted for use in integrated circuits, comprising:
a matched pair of differentially connected transistors of the same polarity type;
a pair of substantially equal value resistors;
a biasing transistor of the said same polarity type having an emitter, base and collector;
an amplifier transistor of the said same polarity type having an emitter, base and collector and having essentially the same characteristics as said biasing transistor and in close proximity thereto, the emitters of said biasing transistor and said amplifier transistor connected to a common voltage point, each of the bases of said transistors connected to a common voltage point via one of said equal resistors, the collector of said biasing transistor being connected to the base of said amplifier transistor via one of said equal resistors, and the base of said biasing transistor being connected by one of said equal resistors to its own collector; and
a means coupling the collector of one of said differentially-connected transistors to the base of said biasing transistor, and a means coupling the collector of the other transistor to said base of the amplifier transistor, whereby a differential input, single ended output amplifier is provided.

References Cited

UNITED STATES PATENTS

| | | | |
|---|---|---|---|
| 3,157,817 | 11/1964 | Shimada. | |
| 3,167,721 | 1/1965 | Broadhead | 330—19 |

OTHER REFERENCES

Bertoya, "A Transistor Amplifier with D.C. and A.C. Feedback Stabilization," Electronic Engineering, April 1964, pp. 240–245.

Hager, "Network Design of Microcircuits," Electronics, Sept. 4, 1959, pp. 44–49.

Housey et al., "Using Integrated As Feedback Amplifiers," Electronic Design, Mar. 2, 1964, pp. 49-52.

ROY LAKE, *Primary Examiner.*

J. B. MULLINS, *Assistant Examiner.*